United States Patent
Hwang et al.

(10) Patent No.: US 8,027,199 B2
(45) Date of Patent: Sep. 27, 2011

(54) SEMICONDUCTOR MEMORY DEVICE

(75) Inventors: Soon Wook Hwang, Gyeonggi-do (KR); Ki Tae Park, Gyeonggi-do (KR); Yeong Taek Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/823,726

(22) Filed: Jun. 25, 2010

(65) Prior Publication Data

US 2010/0265769 A1 Oct. 21, 2010

Related U.S. Application Data

(63) Continuation of application No. 12/142,460, filed on Jun. 19, 2008, now Pat. No. 7,755,944.

(30) Foreign Application Priority Data

Jun. 20, 2007 (KR) .................. 10-2007-0060483

(51) Int. Cl.
 *G11C 16/04* (2006.01)
(52) U.S. Cl. ......... 365/185.11; 365/230.03; 365/185.17; 365/185.23; 365/185.05
(58) Field of Classification Search ............. 365/185.11, 365/185.17, 185.23, 185.05, 230.03
See application file for complete search history.

(56) References Cited

U.S. PATENT DOCUMENTS

| | | | | |
|---|---|---|---|---|
| 4,884,241 A * | 11/1989 | Tanaka et al. | ............ | 365/185.21 |
| 5,559,737 A * | 9/1996 | Tanaka et al. | ............ | 365/185.25 |
| 5,969,990 A * | 10/1999 | Arase | ...................... | 365/185.25 |
| 5,990,514 A * | 11/1999 | Choi et al. | .................... | 257/315 |
| 6,044,017 A * | 3/2000 | Lee et al. | ................. | 365/185.18 |
| 6,731,540 B2 * | 5/2004 | Lee et al. | ................. | 365/185.17 |
| 6,930,536 B2 * | 8/2005 | Nazarian et al. | ............. | 327/536 |
| 7,095,656 B2 * | 8/2006 | Lee | ........................... | 365/185.29 |
| 7,180,787 B2 * | 2/2007 | Hosono et al. | ........... | 365/185.24 |
| 7,239,556 B2 * | 7/2007 | Abe et al. | ................. | 365/185.33 |
| 7,272,049 B2 * | 9/2007 | Kang et al. | ................. | 365/185.2 |
| 7,283,405 B2 * | 10/2007 | Yamanaka et al. | ........ | 365/189.05 |
| 7,301,815 B2 * | 11/2007 | Kurata et al. | ............. | 365/185.2 |
| 7,379,351 B2 * | 5/2008 | Kwon et al. | ............. | 365/189.06 |
| 7,486,554 B2 * | 2/2009 | Park et al. | ................ | 365/185.02 |
| 7,518,920 B2 * | 4/2009 | Kang | ....................... | 365/185.17 |
| 7,551,480 B2 * | 6/2009 | Park et al. | ................ | 365/185.11 |
| 7,561,468 B2 * | 7/2009 | Hosono | ..................... | 365/185.17 |
| 7,630,251 B2 * | 12/2009 | Hosono | ..................... | 365/185.2 |
| 7,652,926 B2 * | 1/2010 | Kang et al. | ................. | 365/185.2 |
| 7,710,778 B2 * | 5/2010 | Beltrami et al. | ......... | 365/185.17 |
| 7,733,702 B2 * | 6/2010 | Hosono | ..................... | 365/185.2 |
| 7,755,944 B2 * | 7/2010 | Hwang et al. | ............ | 365/185.11 |
| 7,782,675 B2 * | 8/2010 | Matsunaga et al. | ...... | 365/185.17 |

* cited by examiner

*Primary Examiner* — Viet Nguyen

(74) *Attorney, Agent, or Firm* — F. Chau & Associates, LLC

(57) ABSTRACT

An electrically erasable programmable non-volatile semiconductor memory device. The semiconductor memory device includes a memory cell array comprising a plurality of memory blocks, each memory block comprising a plurality of memory cells, a dummy memory cell, and a select gate transistor. Transfer transistors each having a current path connected between a corresponding wordline enable signal line and a corresponding wordline are controlled by an output of a block selection circuit. The transfer transistors include a dummy transfer transistor electrically coupled to the dummy memory cell, and configured to transmit a dummy wordline enable signal.

8 Claims, 5 Drawing Sheets

SEMICONDUCTOR MEMORY DEVICE

CROSS-REFERENCE TO RELATED PATENT APPLICATION

This application is a Continuation Application of U.S. patent application Ser. No. 12/142,460 filed Jun. 19, 2008, now U.S. Pat. No. 7,755,944 which claims benefit to Korean Patent Application No. 10-2007-0060483 filed on Jun. 20, 2007, the contents of which are herein incorporated by reference in their entireties.

FIELD OF THE INVENTION

The present invention relates to a semiconductor memory device, and more particularly, to an electrically erasable and programmable non-volatile semiconductor memory device.

BACKGROUND OF THE INVENTION

FIG. 1 illustrates the pattern of a transfer transistor unit installed in a row decoder of a conventional NAND-type flash memory. A transfer transistor transmits a wordline enable signal corresponding to a wordline address and a selection gate enable signal to a block selected from a memory cell array. To simplify the drawing and explanation, a case where there are 8 transfer transistors will be described.

The transfer transistor unit includes transfer transistors Q0 through Q7 to transmit the wordline enable signal to wordlines WL0 through WL7. Each transfer transistor is an NMOS transistor formed on a p-type substrate and is structured such that a source/drain region has a satisfactory resistance against a program voltage and an erase voltage.

Referring to FIG. 1, during a program operation, a threshold voltage of a transfer transistor, i.e., 20+Vth, for example, 22 V, is applied to the gates of the transfer transistors Q0 through Q7. As a result, 20 V is applied to a selected wordline among the wordlines WL0 through WL7. In addition, 0 V is applied to non-selected wordlines adjacent to the selected wordline and 10 V is applied to the other non-selected wordlines.

The lower portions of the transfer transistors Q0 through Q3 are arranged in order of CG1 (WL1), CG3 (WL3), CG0 (WL0), and CG2 (WL2), and therefore, a potential difference between the transfer transistors Q1, Q3, Q0, and Q2 adjacent each other in X directions (i.e., X1, X2, and X3) is suppressed to 10 V. In addition, the upper portions of the transfer transistors Q4 through Q7 are arranged in order of CG5 (WL5), CG7 (WL7), CG4 (WL4), and CG6 (WL6), and therefore, a potential difference between the transfer transistors Q5, Q7, Q4, and Q6 adjacent each other in the X directions X1, X2, and X3 is suppressed to 10 V. Further, a potential difference between the transfer transistors Q0 and Q4, and Q3 and Q7, adjacent each other in Y directions (i.e., Y1, Y2, Y3, and Y4) is suppressed to 10 V.

In order to prevent current from leaking due to the potential difference described above, the arrangement of transfer transistors in the transfer transistor unit can be controlled so that a distance between the transfer transistors is optimized. However, a transfer transistor for driving a select transistor is different from a transfer transistor for driving a wordline, and therefore, a distance therebetween may be different.

SUMMARY OF THE INVENTION

Some embodiments of the present invention provide a semiconductor memory device for preventing current leakage and reducing its occupying area when a dummy wordline is added.

According to some embodiments of the present invention, there is provided a semiconductor memory device including a memory cell array comprising a plurality of memory blocks, each memory block comprising a plurality of memory cells, a dummy memory cell, and a select gate transistor. The memory device may include a block selection circuit configured to select a memory block from the plurality of memory blocks. There may also be provided a plurality of wordline enable signal lines configured to transmit a voltage to a plurality of wordlines associated with the plurality of memory blocks, and a plurality of transfer transistors each having a current path connected between a corresponding one among the wordline enable signal lines and a corresponding one among the wordlines and being controlled by an output of the block selection circuit, the plurality of transfer transistors including at least one dummy transfer transistor configured to transmit a dummy wordline enable signal.

The dummy memory cell may be interposed between a memory cell at one end among the plurality of memory cells and the select gate transistor and may be excluded from data storage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
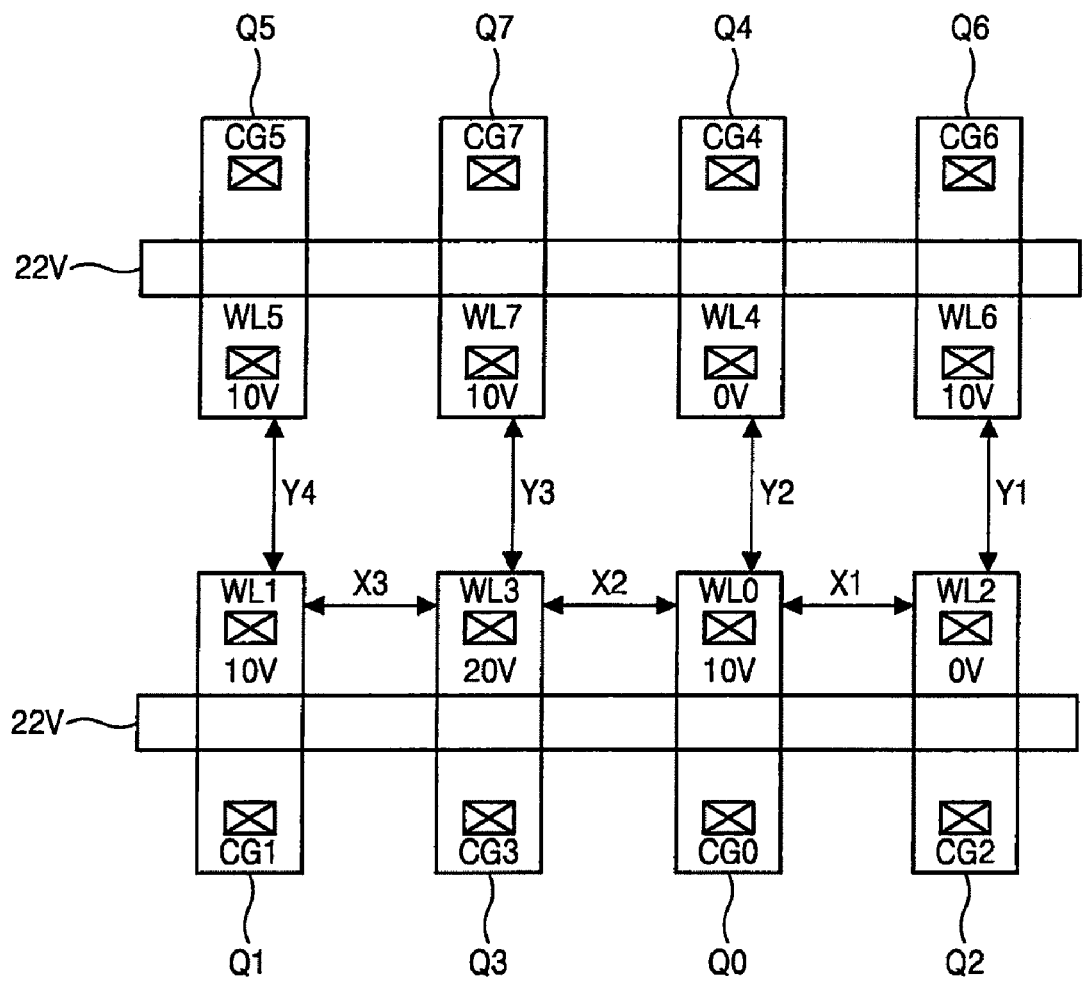
FIG. 1 is a plan view of a transfer transistor unit installed in a row decoder of a conventional semiconductor memory device.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The scope of the present invention will be defined by the claims. Therefore, well-known processes, element structures and technology will not be described in detail in some embodiments of the present invention in order to avoid ambiguousness. Embodiments of the present invention described hereinafter implicate their complementary embodiments. In the drawings, like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/."

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
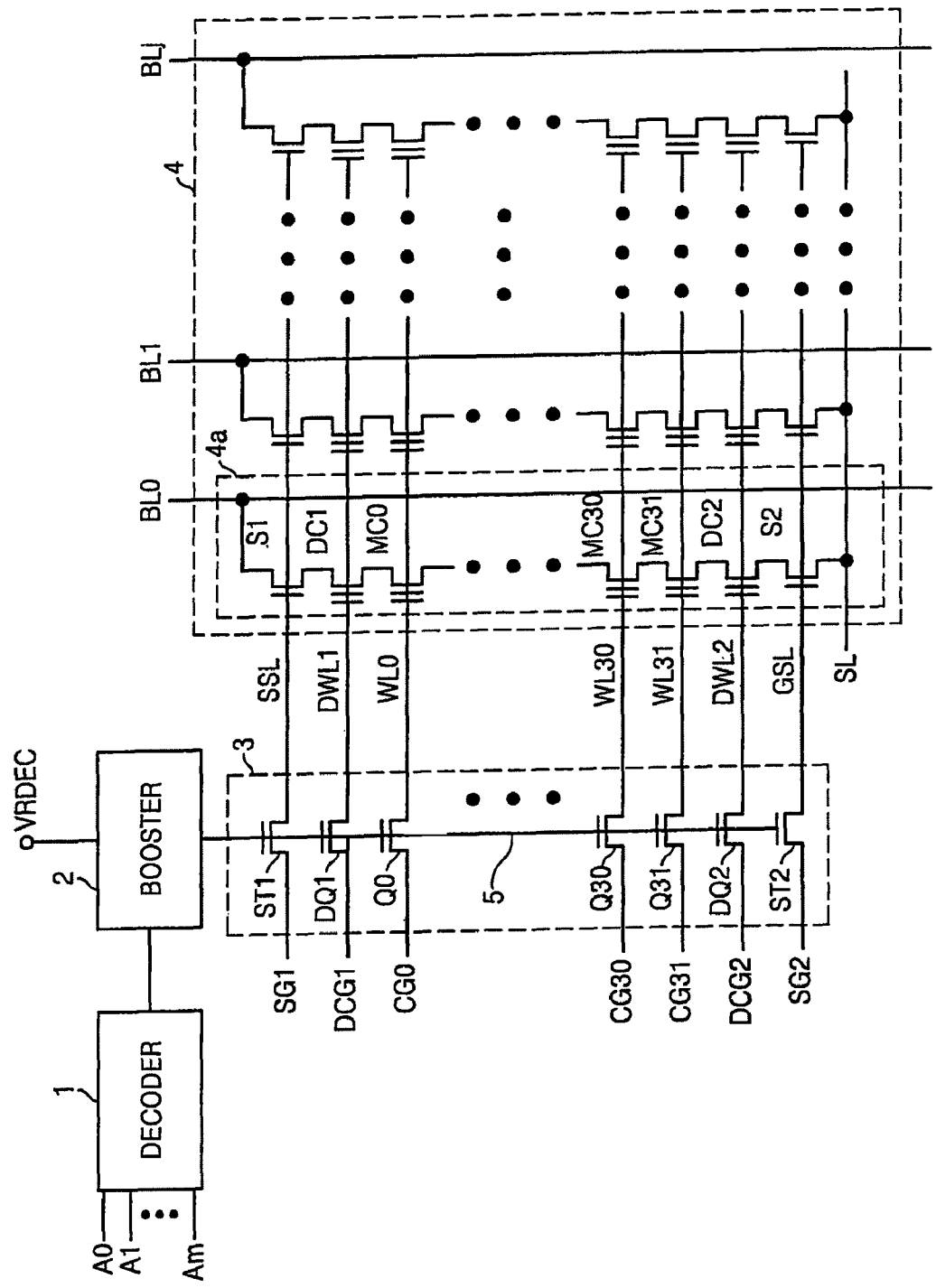
FIG. 2 is a circuit diagram of a part of a row decoder and a memory cell array in a NAND-type flash memory device according to some embodiments of the present invention.

A semiconductor memory device according to some embodiments of the present invention will be described in detail with reference to FIG. 2 below. FIG. 2 is a circuit diagram of a part of a row decoder and a memory cell array in a NAND-type flash memory device according to some embodiments of the present invention. Referring to FIG. 2, the memory device includes a decoder 1, a booster 2, a transfer transistor unit 3, and a NAND cell block 4.

A row address or pre-decode signals A0, A1, . . . , Am corresponding to the row address are provided to the decoder 1 and decoded by the decoder 1. As a result, at least one NAND cell block 4 in a memory cell array is selected by the decoder 1. A decode signal is output from the decoder 1 and is provided to the booster 2. The booster 2 controls a gate line 5 of the transfer transistor unit 3 to provide wordline enable signals CG0 through CG31 over lines corresponding to a wordline address, and selection gate enable signals SG1 and SG2 to the selected NAND cell block 4.

The transfer transistor unit 3 includes transfer transistors Q0 through Q31 configured to respectively transmit the wordline enable signals CG0 through CG31 from wordline enable signal lines to wordlines WL0 through WL31. The transfer transistor unit 3 may also include transfer transistors ST1 and ST2 respectively configured to transmit the selection gate enable signals SG1 and SG2 to selection gate lines SSL and GSL. In addition, the transfer transistor unit 3 may also include transfer transistors DQ1 and DQ2 (hereinafter, referred to as "dummy transfer transistors") respectively configured to transmit dummy wordline enable signals DCG1 and DCG2 from dummy wordline enable signal lines to dummy wordlines DWL1 and DWL2.

When the NAND cell block 4 is selected, the booster 2 may apply a predetermined voltage to the gate line 5 of the transfer transistor unit 3 in response to the decode signal output from the decoder 1 to turn on the gate line 5. Conversely, when the NAND cell block 4 is not selected, the gate line 5 of the transfer transistor unit 3 is grounded so that it is turned off.

In the NAND-type flash memory device according to the embodiments of the present invention, a single NAND cell 4a may include two select gate transistors S1 and S2 and memory cells MC0 through MC31 (memory cell transistors MC0 through MC31). Further, the NAND cell 4a may also include a dummy memory cells DC1 disposed between the select gate transistor S1 and the memory cell MC0, and a dummy memory cell DC2 disposed between the select gate transistor S2 and the memory cell MC31.

The gates of the select gate transistors S1 and S2 are respectively connected with the selection gate lines SSL and GSL. The current paths of the memory cells MC0 through MC31 are connected in series between first ends of the current paths of the select gate transistors S1 and S2, and the gates or control gates thereof are respectively connected with the wordlines WL0 through WL31. A second end of the current path of the select gate transistor S2 is connected with a source line SL and a second end of the current path of the select gate transistor S1 is connected with a bitline BL0 among a plurality of bitlines BL0 through BLj.

The memory cells MC0 and MC31 are respectively adjacent to the select gate transistors S1 and S2 on one side and respectively adjacent to the memory cells MC1 and MC30 on the other side and the select gate transistors S1 and S2 are different from the memory cells MC0 through MC31 in terms of structure and operating voltage. Accordingly, the memory cells MC0 and MC31 adjacent to the select gate transistors S1 and S2 have different coupling capacitance than the other memory cells MC1 through MC30. Therefore, the memory cells MC0 and MC31 adjacent to the select gate transistors S1 and S2 may have different operating characteristics than the other memory cells MC1 through MC30. To compensate for such difference, the dummy memory cells DC1 and DC2 may be respectively disposed between the select gate transistor S1 and the memory cell MC0 and the select gate transistor S2 and the memory cell MC31.

These dummy memory cells DC1 and DC2 are excluded from data storage. The dummy memory cells DC1 and DC2 may have the same size as transistors forming the memory cells MC0 through MC31. Due to the dummy memory cells DC1 and DC2, the memory cells MC0 and MC31 at both ends have left-right symmetry similar to that of the memory cells MC1 through MC30 in the middle. As a result, all of the memory cells MC0 and MC31 have the same condition of adjacent memory cells, and therefore, program and erase characteristics become the same with respect to all of the memory cells MC0 and MC31.

As shown in the current embodiments of the present invention, the NAND cell 4a includes the 32 memory cells MC0 through MC31. But a persons having skill in the art will recognize that the number of memory cells included in the NAND cell 4a may vary. For example, the number of memory cells included in the NAND cell 4a may be 16 or 64, among other possibilities.

The NAND cell block 4 is selected by the row address or the pre-decode signals A0 through Am of the row address. Next, when an address of the wordlines WL0 through WL31 or the dummy wordlines DWL1 and DWL2 in the NAND cell 4a is selected, the memory cells MC0 through MC31 or the dummy memory cells DC1 and DC2 are accessed.

Figure 3:
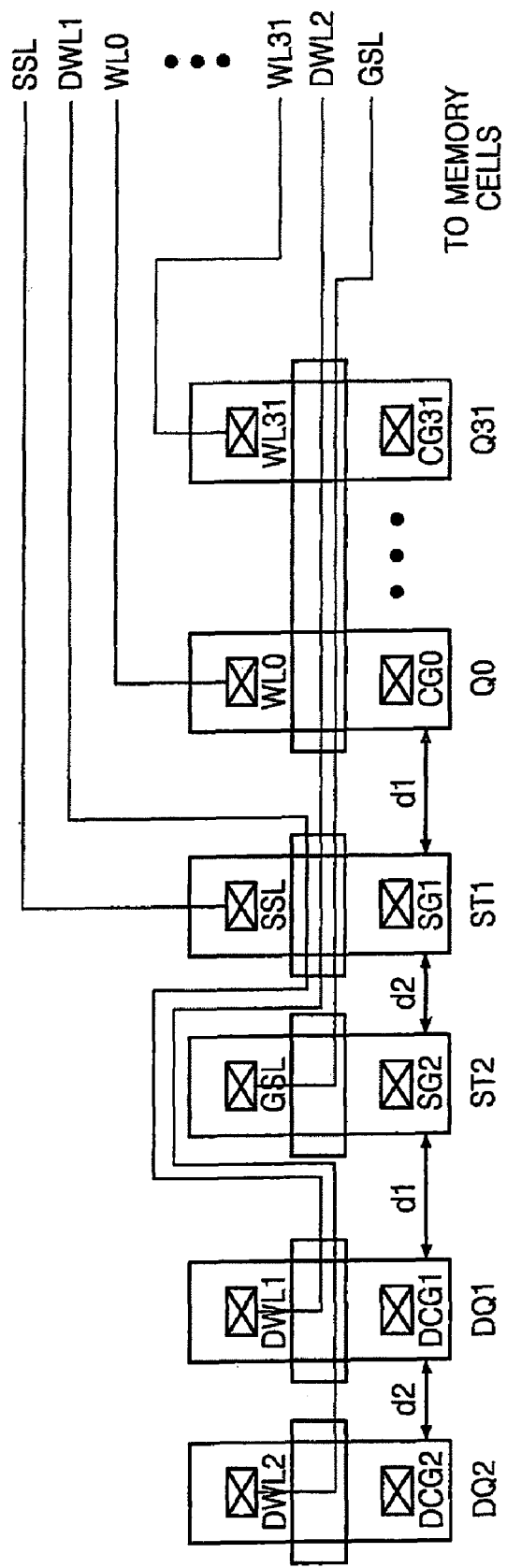
FIGS. 3 and 4 are plan views of a transfer transistor unit installed in the row decoder illustrated in FIG. 2 according to some embodiments of the present invention.
Figure 4:
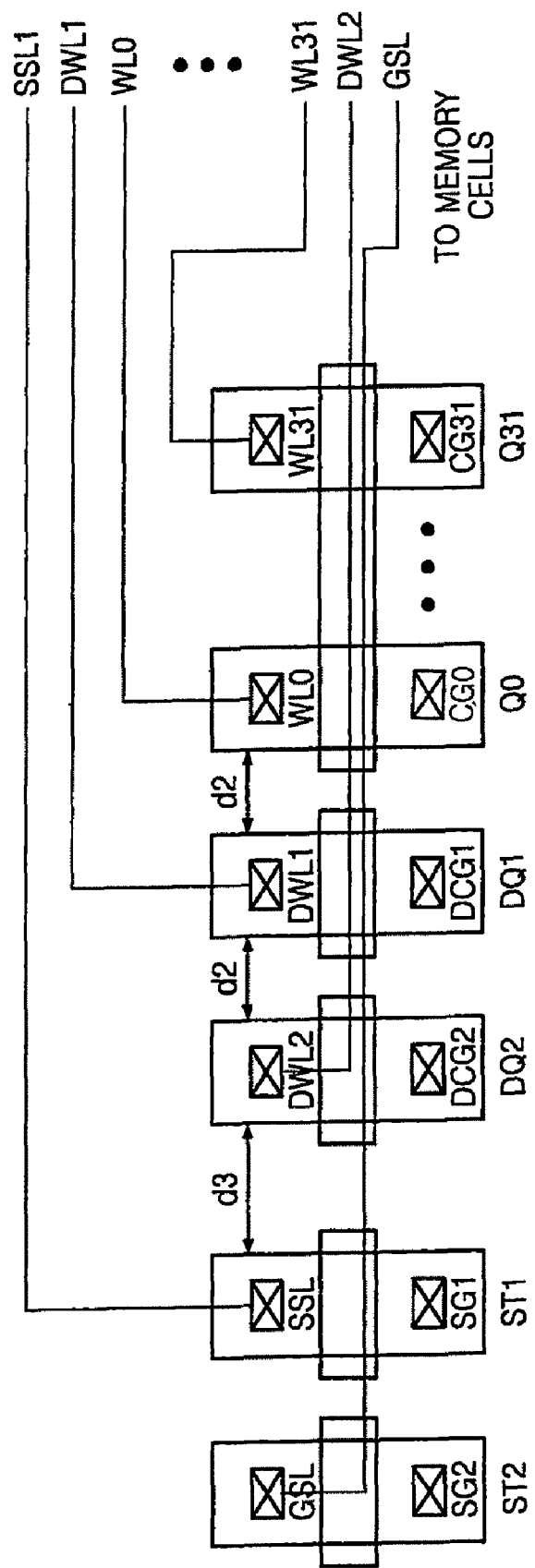

FIGS. 3 and 4 are plan views of a transfer transistor unit (i.e., transfer transistor unit 3 of FIG. 2), which may be installed in a row decoder in a semiconductor memory device according to some embodiments of the present invention. Referring to FIGS. 3 and 4, the transfer transistor unit in the row decoder may include the transfer transistors Q0 through Q31 to transmit the wordline enable signals CG0 through CG31 from wordline enable signal lines to the wordlines WL0 through WL31. The transfer transistors ST1 and ST2 may transmit the selection gate enable signals SG1 and SG2 to the select gate lines SSL and GSL, respectively. Further, the dummy transfer transistors DQ1 and DQ2 minimize a potential difference during a program operation.

In the transfer transistor unit, the dummy transfer transistors DQ1 and DQ2 may be disposed adjacent to the transfer transistors ST1 and ST2 configured to transmit the selection gate enable signals SG1 and SG2. In addition, the dummy transfer transistor DQ1, which may transmit the dummy wordline enable signal DCG1 from a dummy wordline enable signal line to the dummy wordline DWL1, may be disposed apart from the select gate transistor S1 (of FIG. 2). Similarly, the dummy transfer transistor DQ2, which may transmit the dummy wordline enable signal DCG2 from a dummy wordline enable signal line to the dummy wordline DWL2, may be disposed apart from the select gate transistor S2 (of FIG. 2).

In detail, referring to FIG. 3, the transfer transistors DQ1, DQ2, ST1, ST2, and Q0 through Q31 may be arranged in order and operation of: the dummy transfer transistor DQ2 configured to transmit the dummy wordline enable signal DCG2 to the dummy wordline DWL2, the dummy transfer transistor DQ1 configured to transmit the dummy wordline enable signal DCG1 to the dummy wordline DWL1, the transfer transistor ST2 configured to transmit the selection gate enable signal SG2 to the selection gate line GSL, the transfer transistor ST1 configured to transmit the selection gate enable signal SG1 to the selection gate line SSL, and the transfer transistors Q0 through Q31 respectively configured to transmit the wordline enable signals CG0 through CG31 from wordline enable signal lines to the wordlines WL0 through WL31. An isolation gap d1 between the dummy transfer transistor DQ1 and the transfer transistor ST2 and between the transfer transistor ST1 and the transfer transistor Q0 is greater than an isolation gap d2 between the dummy transfer transistors DQ1 and DQ2 (or a gap between the dummy transfer transistor DQ1 or DQ2 and a transfer transistor Q closest to the dummy transfer transistor DQ1 or DQ2 among the transfer transistors Q0 through Q31). The transfer transistors Q0 through Q31 may respectively transmit the wordline enable signals CG0 through CG31 from wordline enable signal lines to the wordlines WL0 through WL31.

Referring to FIG. 4, the transfer transistors DQ1, DQ2, ST1, ST2, and Q0 through Q31 may be arranged in order and operation of the transfer transistor ST2 configured to transmit the selection gate enable signals SG2 to the selection gate line GSL, the transfer transistor ST1 configured to transmit the selection gate enable signals SG1 to the selection gate line SSL, the dummy transfer transistor DQ2 configured to transmit the dummy wordline enable signal DCG2 to the dummy wordline DWL2, the dummy transfer transistor DQ1 configured to transmit the dummy wordline enable signal DCG1 to the dummy wordline DWL1, and the transfer transistors Q0 through Q31 respectively configured to transmit the wordline enable signals CG0 through CG31 from wordline enable signal lines to the wordlines WL0 through WL31. Here, an isolation gap d3 between the transfer transistor ST1 and the dummy transfer transistor DQ2 may be the same as or greater than an isolation gap d2 between the dummy transfer transistor DQ2 and the dummy transfer transistor DQ1, or between the dummy transfer transistor DQ1 and the transfer transistor Q0. The isolation gap d3 may be less than the isolation gap d1 illustrated in FIG. 3.

When the dummy transfer transistors DQ2 and DQ1 are disposed before the transfer transistors ST2 and ST1 as illustrated in FIG. 3 or the dummy transfer transistors DQ2 and DQ1 are disposed between the transfer transistors ST2 and ST1 and the transfer transistors Q0 through Q31 as illustrated in FIG. 4, gate lines of the transfer transistors DQ1, DQ2, ST1, ST2, and Q0 through Q31 can be isolated from one another, thereby increasing reliability.

When the dummy transfer transistors DQ2 and DQ1 are disposed between the transfer transistors ST2 and ST1 and the transfer transistors Q0 through Q31, as illustrated in FIG. 4, the dummy transfer transistors DQ2 and DQ1 may function as a buffer between the transfer transistors ST2 and ST1 and the transfer transistors Q0 through Q31. In addition, the isolation gap d3 between the transfer transistor ST1 and the dummy transfer transistor DQ2 and the isolation gap d2 between the dummy transfer transistor DQ1 and the transfer transistor Q0 illustrated in FIG. 4 may be less than the isolation gap d1 between the dummy transfer transistor DQ1 and the transfer transistor ST2, or between the transfer transistor ST1 and the transfer transistor Q0 illustrated in FIG. 3, so that the increase in an occupying area due to addition of the dummy transfer transistors DQ1 and DQ2 can be minimized.

In addition, referring to FIGS. 3 and 4, tungsten wires (lines) are drawn out from wordline terminals in the transfer transistor unit 3 and extend toward memory cells. The tungsten wires may be connected with poly silicon wires or polycide wires forming the wordlines WL0 through WL31 in a memory cell array so that the wordlines WL0 through WL31 are arranged in order of wordline addresses. Since the pitch of the wordlines WL0 through WL31 in the memory cell array is the most fine in design rules, it is necessary to arrange the wires drawn out from the wordline terminals of the transfer transistor unit 3 (hereinafter, referred to as the "drawn wires") in the same pattern as wires of the wordlines WL0 through WL31 (hereinafter, referred to as the "wordline wires") in order to easily connect the drawn wires with the wordline wires. In addition, it is preferable that the drawn wires are led to the wordline wires on a metal wiring layer as close as possible to a wordline wiring layer (here, e.g., the poly silicon wires or the polycide wires), which is a control gate of memory cells. If the number of metal wiring layers where the drawn wires are connected with the wordline wires increases, the control gate of the non-volatile memory device undergoes a via contact process in a floating state and memory cells may experience process damage. Accordingly, it is preferable to draw the wires and allocate addresses as illustrated in FIGS. 3 and 4, instead of crossing the drawn wires in the transfer transistor unit 3.

As described above, when drawn lines from the wordline terminals of transfer transistors are arranged in the same pattern as wordlines in a memory cell array, the drawn wires can be easily connected with the wordlines having very strict design rules. In addition, when the drawn wires from the wordline terminals of the transfer transistors to the wordlines are laid out on a metal layer one layer up from a wiring layer forming the wordlines, connection change between metal layers can be eliminated. As a result, unnecessary process damage on a control gate of wordlines or a non-volatile memory device can be reduced. Also, when a transfer transistor unit includes dummy transfer transistors, current leakage can be prevented without increasing a gap between the transfer transistors.

Figure 5:
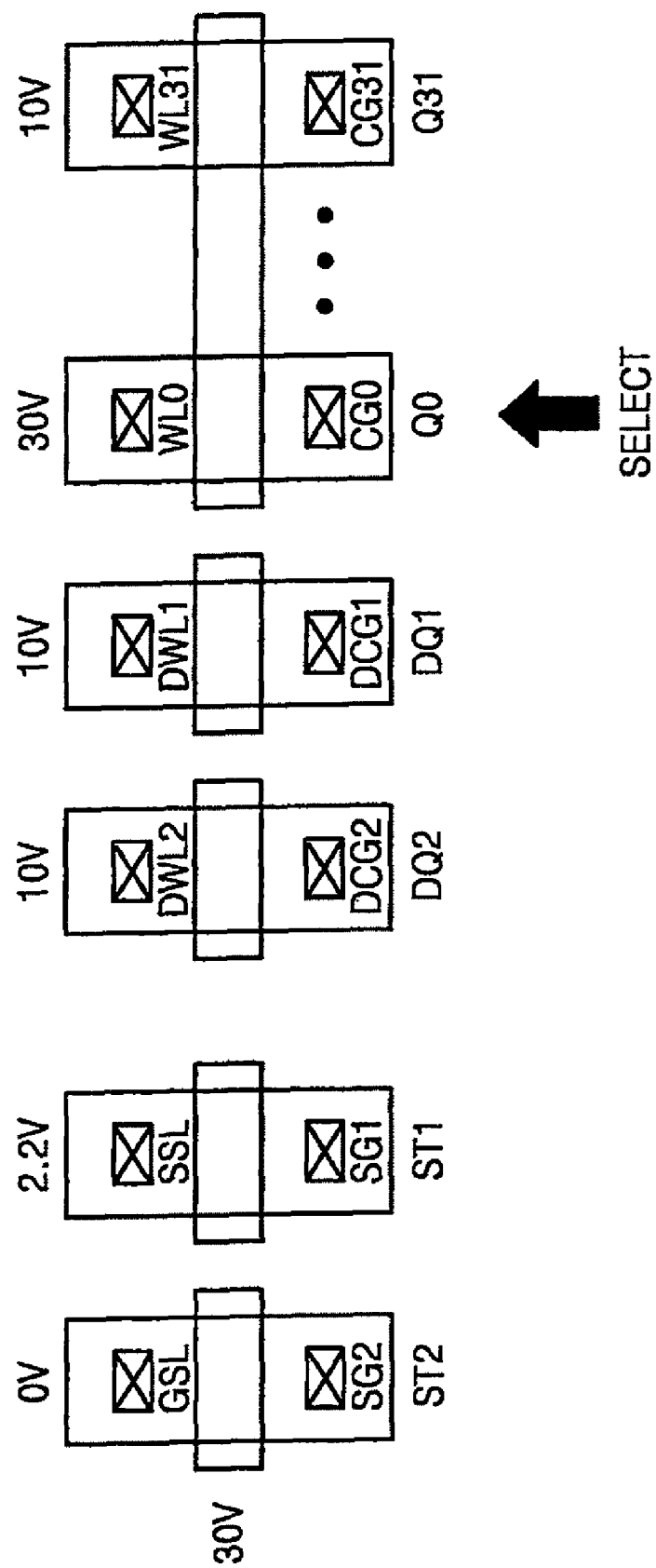
FIG. 5 is a plan view of the transfer transistor unit illustrated in FIG. 4 for explaining a potential difference between transfer transistors.

Hereinafter, bias conditions when the wordline WL0 corresponding to the wordline enable signal CG0 is selected in a semiconductor memory device according to some embodiments of the present invention will be described with reference to FIGS. 2, 4, and 5. FIG. 5 is a plan view of the transfer transistor unit illustrated in FIG. 4 for explaining a potential difference between transfer transistors.

Referring to FIGS. 2, 4, and 5, when the memory cell MC0 is a selected cell, the wordline WL0 is a selected wordline. The other memory cells MC1 through MC31 are non-selected cells. When data is programmed to a memory cell, program data may usually be transmitted to a bitline first. According to some embodiments of the present invention, the NAND-type flash memory device may program every memory cell selected by a single wordline at a time to increase a program speed and may have a data latch corresponding to a unit in which data is programmed at a same time, for example, 512 bytes. The data latch may transmit a power supply voltage Vdd to a bitline BL for "1" program cells and transmit a ground voltage (i.e., 0 V) to the bitline BL for "0" program cells. In addition, a row decoder driving voltage VRDEC may be applied to a selected block having a wordline to be programmed and a voltage, for example, 30 V, higher than the row decoder driving voltage VRDEC may be applied to the gate 5 of the transfer transistor unit 3. Accordingly, the power supply voltage Vdd may be applied to the gate of the select gate transistor S1 in the selected NAND cell 4a and a channel in the NAND cell 4a may be precharged via the bitline BL0.

Next, a potential VPASS, for example, about 10 V, may be applied to all non-selected wordlines WL2 through WL31 except for the non-selected wordline WL1 adjacent to the selected wordline WL0, and to the dummy wordlines DWL1 and DWL2. Next, a program voltage VPGM, for example, about 30 V, may be applied to the selected wordline WL0, so that the selected memory cell MC0 is programmed.

The row decoder selectively transmits a wordline voltage and a dummy wordline voltage. In this row decoder, a potential difference between the transfer transistor ST1 and the dummy transfer transistor DQ1 may be, for example, 7.8 V and a potential difference between the dummy transfer transistor and the transfer transistor Q1 may be, for example, about 20 V. These potential differences are much less than a potential difference when the dummy transfer transistors DQ1 and DQ2 are not disposed between the transfer transistors ST1 and Q1. Accordingly, current leakage caused by the potential difference between the transfer transistors ST1 and Q1 can be prevented, and therefore, reliability is increased.

As described above, a semiconductor memory device according to some embodiments of the present invention includes a dummy transfer transistor in a row decoder, thereby preventing current from leaking and reducing its occupying area. Therefore, the competitiveness of products can be increased.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed:

1. A semiconductor memory device comprising:
a transfer transistor unit including a plurality of transistors each of which transmits a control signal to a corresponding line; and
a memory cell array including a plurality of memory strings each of which includes a first selection transistor, a first dummy cell, a plurality of memory cells, which are connected in series,
wherein the plurality of transistors comprises a first transfer transistor coupled to the first selection transistor through the corresponding line, a first dummy transfer transistor coupled to the first dummy cell through the corresponding line and, and a plurality of cell transfer transistors coupled to the plurality of memory cells through the corresponding lines respectively,
wherein the first transfer transistor, the first dummy transfer transistor and at least one of the plurality of cell transfer transistors are arranged in order toward the memory cell array.

2. The semiconductor memory device of claim 1, wherein an isolation gap between the first transfer transistor and the first dummy transistor is larger than an isolation gap between the first dummy transfer transistor and the at least one of the plurality of cell transfer transistors.

3. The semiconductor memory device of claim 1, wherein a gate of the first transfer transistor and a gate of the first dummy transfer transistor are separated from each other.

4. The semiconductor memory device of claim 1, wherein a gate of the first dummy transfer transistor are separated from a gate of the at least one of the plurality of cell transfer transistor.

5. The semiconductor memory device of claim 1, wherein each of the plurality of memory strings further includes a second selection transistor and a second dummy cell, and the plurality of transistors further comprises a second transfer transistor coupled to the second selection transistor through a corresponding line and a second dummy transfer transistor coupled to the second dummy cell through a corresponding line.

6. The semiconductor memory device of claim 5, wherein the second and first transfer transistors, the second and first dummy transfer transistors and at least one of the plurality of cell transfer transistors are arranged in order toward the memory cell array.

7. The semiconductor memory device of claim 6, wherein an isolation gap between the first transfer transistor and the second dummy transistor is larger than an isolation gap between the first dummy transfer transistor and the at least one of the plurality of cell transfer transistors.

8. The semiconductor memory device of claim 6, wherein an isolation gap between the first transfer transistor and the second dummy transistor is larger than an isolation gap between the first dummy transfer transistor and the second dummy transfer transistor.

* * * * *